(12) United States Patent
Szu

(10) Patent No.: US 6,537,097 B1
(45) Date of Patent: Mar. 25, 2003

(54) DEVICE FOR CPU SOCKET ACTUATION

(75) Inventor: Ming-Lun Szu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/017,720

(22) Filed: Dec. 14, 2001

(51) Int. Cl.[7] ................................................ H01R 4/50

(52) U.S. Cl. ...................................................... 439/342

(58) Field of Search .................................. 439/342, 259

(56) References Cited

U.S. PATENT DOCUMENTS 6,383,007 B1 * 5/2002 Lin et al. ..................... 439/342

* cited by examiner

Primary Examiner—Tho D. Ta
(74) Attorney, Agent, or Firm—Wei Te Chung

(57) ABSTRACT

An actuation device comprises a frame with an actuator. The frame is substantially U-shaped and has at least one claw portion and a actuation portion formed thereon and extending from edges of the frame. The actuation portion is located above the claw portion and extends in a direction far from the CPU, and the actuation portion engages directly with a screw driver when the CPU is actuated.

4 Claims, 4 Drawing Sheets

DEVICE FOR CPU SOCKET ACTUATION

BACKGROUND OF THE INVENTION

1. Field of the Invention

The present invention relates to an actuation device for a central processing unit (CPU), especially to an actuation device which can protect the CPU from being damaged during the CPU actuation process.

2. Description of the Related Art

Referring to FIG. 5, a prior art connector is disclosed for electrically connecting a CPU 5' with a printed circuit board (PCB). The connector comprises a housing 2', a cover 3' slidably mounted on the housing 2', and a pair of ear portions 23' formed on opposite sides of the housing 2' with recesses 25' defined therein. For directing the CPU 5' to move over the connector, a screw driver 7' is applied to push the CPU. However, because package material of the CPU is fragile, the CPU tends to be damaged under direct impact by the screw driver.

Accordingly, a frame 44' for cooperating with the screw driver 7' is provided. The frame 44' is positioned on the CPU. A plurality of claws 42' extend from two opposite sides of the frame 44' for clipping sides of the CPU. Two engaging portions 41' extend horizontally for engaging with the screw driver 7' during the CPU actuating process.

However, the conventional CPU socket actuation frame 44' has a relatively short moment arm of resistance force when the screw driver 7' is engaged with the frame 44', and this results in that user can not feel the resistance force during operating stage, therefore the operation force used by user is difficult to control. Accordingly, an improved device is required to overcome the above disadvantage of conventional CPU socket actuation frame 44'.

SUMMARY OF THE INVENTION

An object of the present invention is to provide an actuation device for a CPU which has an increased moment arm of resistance force when a screw driver is engaged with the device.

In order to achieve the objects set forth, a connector assembly in accordance with a preferred embodiment of the present invention comprises an electrical connector, a central processing unit (CPU) and an actuation device. The electrical connector which can electrical engage with the CPU and the connector forming an ear portion at a side thereof. The central processing unit (CPU) having a top surface, a bottom surface and a side wall between the top surface and the bottom surface, the CPU being slidably mounted on the connector beside the ear portion. The actuation device positioned on the CPU comprising a frame located on the top surface of the CPU, a plurality of claw portions extending substantially perpendicularly from edges of the frame along the side wall of the CPU toward the ear portion and an actuation portion which is formed adjacent to the claw portion and is raised above the claw portion, the actuation portion extending from the edge of the frame in a direction from the CPU to the ear portion for directly engaging with an actuating tool to drive the CPU to move over the connector. Whereby the screw driver cannot engage with the CPU directly and the CPU can be protected from being damaged.

DESCRIPTION OF THE PREFERRED EMBODIMENT

Figure 1:
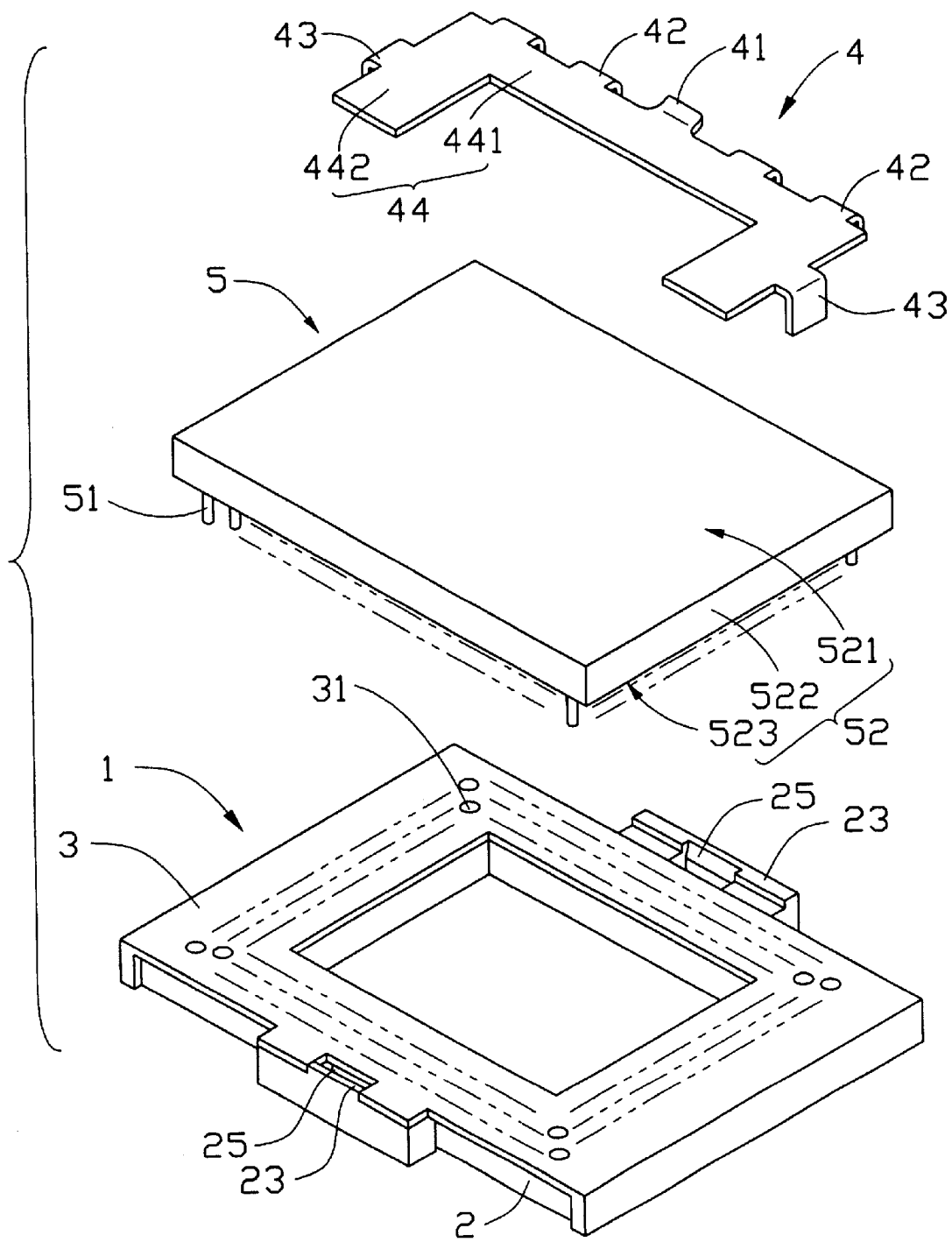
FIG. 1 is an exploded view of an electrical connector assembly in accordance with a preferred embodiment of the present invention.

Reference will now be made to the drawing figures to describe the present invention in detail.

Referring to FIG. 1, a CPU 5 positioned on a socket 1 for engaging with an actuation device 4 comprises a housing 52, a top surface 521 and a bottom surface 523. A plurality of pins 51 extend from the bottom surface 523 and a side wall 522 is defined between the top surface 521 and the bottom surface 523. The socket 1 comprises an insulative housing 2. A cover 3 can slide on the housing 2 and has a plurality of holes 31 defined therein. The housing 2 further comprises two ear portions 23 with a recess 25 opened respectively therein.

Figure 2:
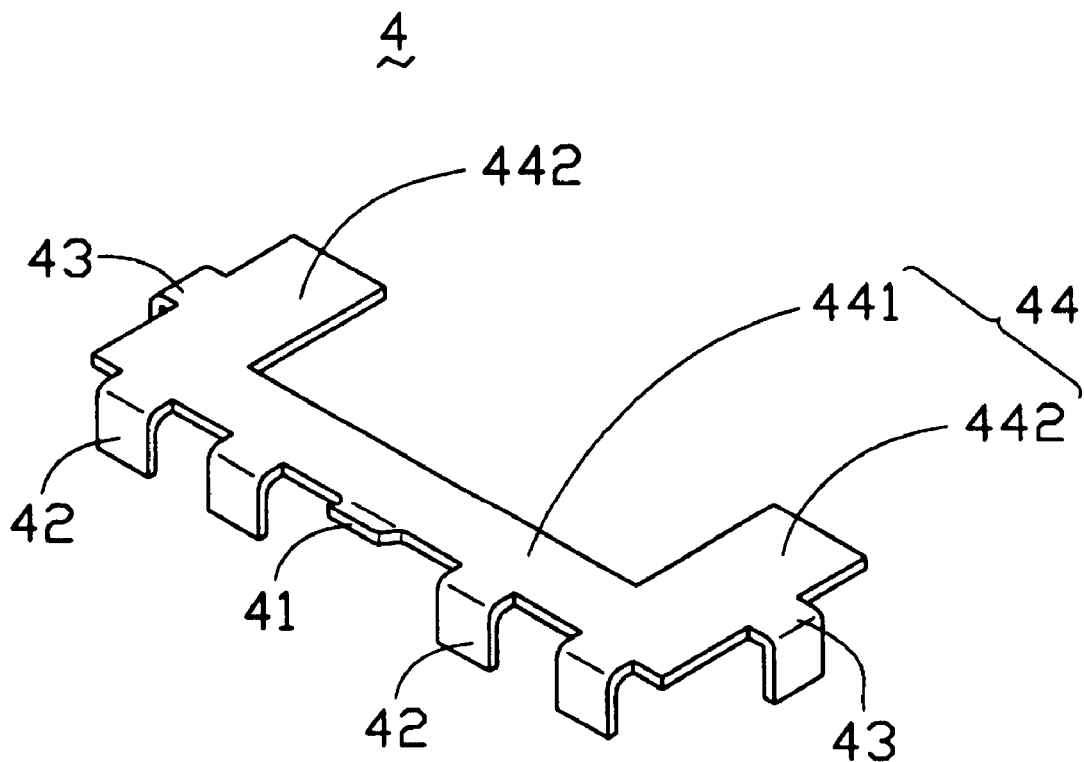
FIG. 2 is a perspective view of an actuation device of FIG. 1.

Referring to FIG. 2, the actuation device 4 according to the present invention comprises a frame 44 and an actuation portion 41. The frame 44 is stamped from a metal sheet as an inverted U-shaped configuration, which comprises a base portion 441, and two arm portions 442 perpendicularly extending from the opposite sides thereof over the top surface 521 of the housing 52 of the CPU 5 for preventing the actuation device 4 from rotating during the operation stage. The frame 44 comprises the actuation portion 41, claw portions 42 and clip portions 43. The actuation portion 41 extends far from the CPU 5 for engaging directly with an actuating tool such as a screw driver 45. The actuation portion 41 extends upwardly from an edge of the base portion 441 toward the recess 25 of the ear portion 23 and is above the base portion 441 and the claw portions 42. The claw portions 42 which are formed adjacent to the actuation portion 41 extend downwardly from the base portion 441 along the side wall 522 of the CPU 5 for engaging closely therewith. Clip portions 43 are defined on edges of the arm portions 442 and extend downwardly therefrom along the side wall 522 of the CPU 5. The clip portions 43 are perpendicular to the claw portion 42.

Figure 3:
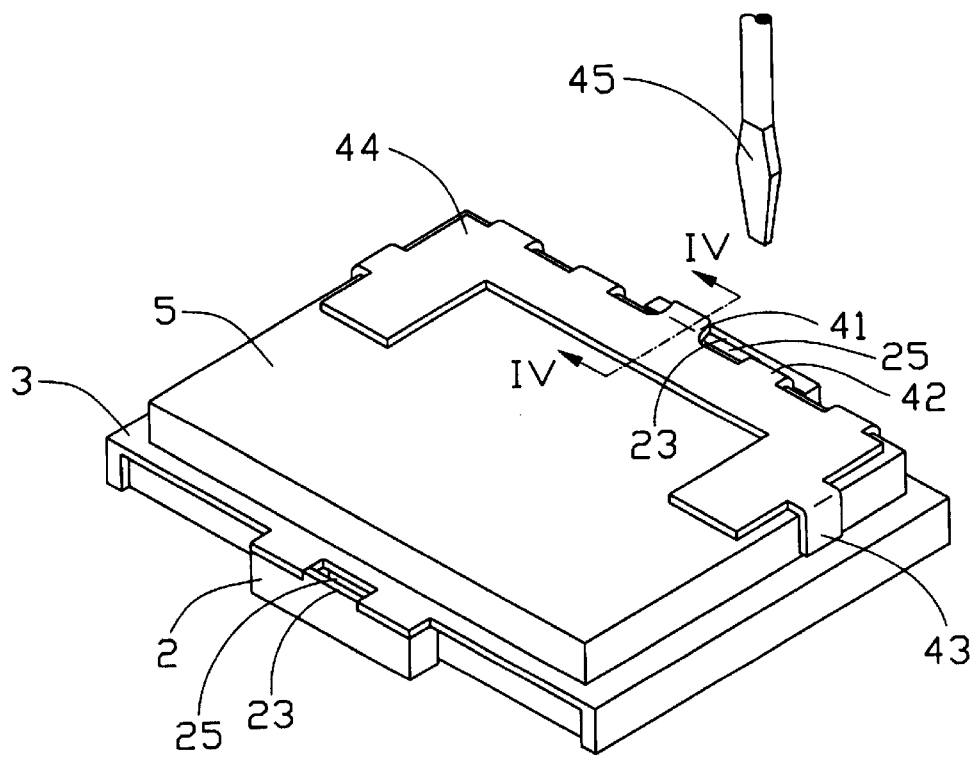
FIG. 3 is an assembled view of the electrical connector assembly of FIG. 1 with a tool.
Figure 4:
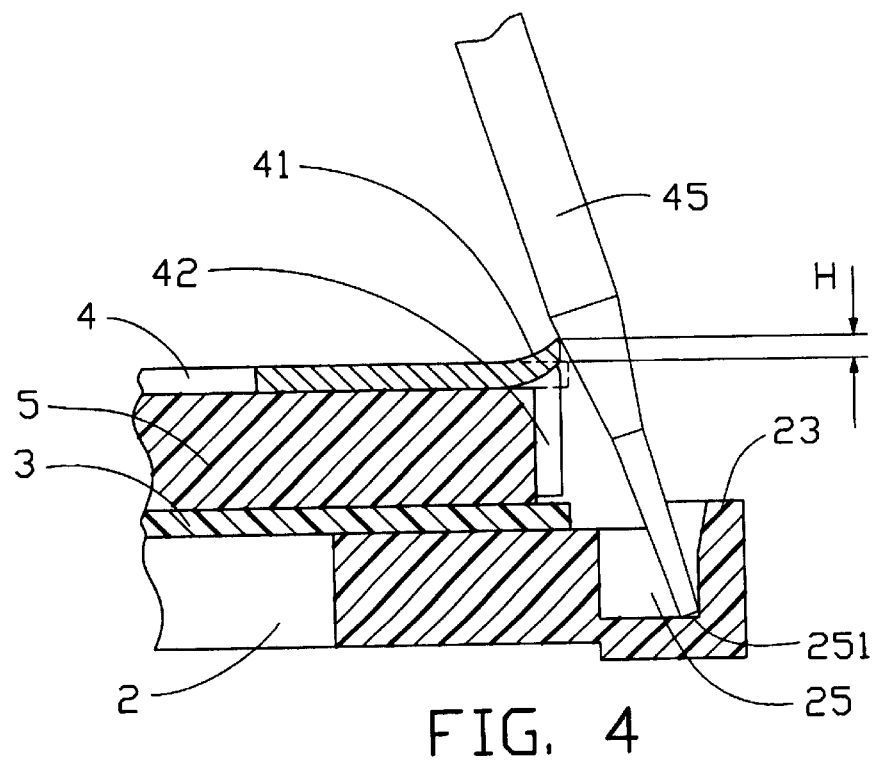
FIG. 4 is a cross-sectional view of the electrical connector assembly along line IV—IV of FIG. 3 (broken line showing a conventional actuating state)
Figure 5:
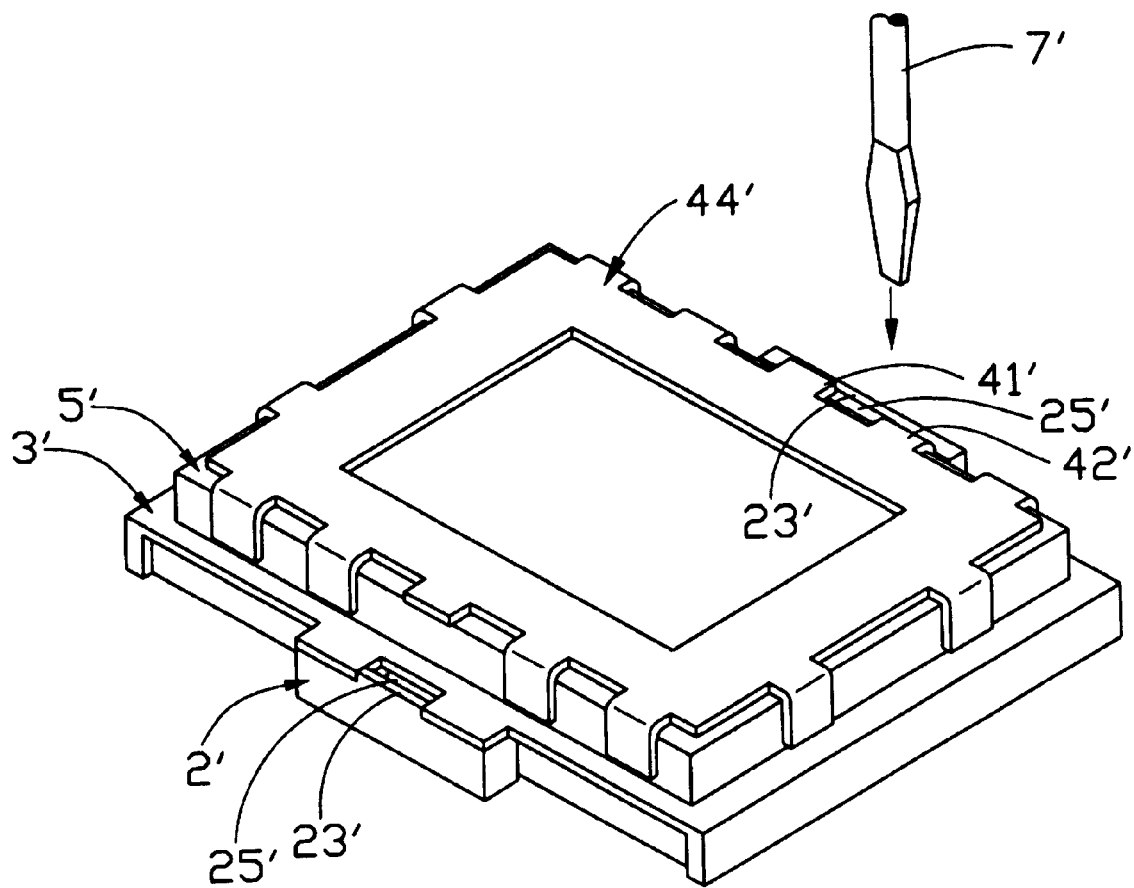
FIG. 5 is an assembled view of a conventional actuation device with the CPU, the socket and the screw driver showing a actuating state.

Referring to FIGS. 3 and 4, in actuation process, initially, the CPU 5 is positioned on the socket 1 with the pins 51 passing through the holes 31 of the cover 3 and then inserted in the contact receiving passages 21. Then, the actuation device 4 is disposed on the CPU 5 with the claw portions 42 and the clip portions 43 engaged with the side walls 522 of the CPU 5, and at the same time the actuation portion 41 is located upon the recess 25 of the ear portion 23 of the housing 2. With the actuation device 45 inserted into the recess 25, a force is loaded toward the direction A to the actuation portion 41 of the actuation device 4. Also, a fulcrum 251 is formed on the recess 25 of the ear 23, whereby a moment of operating force can be very large and the pins 51 of the CPU 5 can be easily pushed to be electrically connected to contacts of the socket 1. When the actuation device 4 is inserted into another recess 25 of the ear portion 23, the pins 51 of the CPU 5 can be pushed off the contacts and the CPU 5 can be removed.

Referring particularly to FIG. 4, in comparison with the conventional actuation device (shown as the broken line), the engagement point with which the actuation device 4 engages the screw driver 45 is higher than the conventional engagement point with which the conventional actuation device engages the screw driver 45 (shown as H). Therefore when the screw driver 45 engaging with the actuation device, the arm of resistance force of the actuation device 4 of the present invention is longer than the arm of resistance force of the conventional one. Whereby with the longer arm of resistance force, the operating force need to be big, therefore user can feel the resistance force during the operation stage and the actuation device 4 of the present invention is easier to be controlled than the conventional one.

What is claimed is:

1. A connector assembly, comprising:

an electrical connector forming an ear portion at a side thereof;

a central processing unit (CPU) having a top surface, a bottom surface and a side wall between the top surface and the bottom surface, the CPU being mounted on the connector beside the ear portion; and an actuation device positioned on the CPU and comprising a frame located on the top surface of the CPU, a plurality of claw portions extending substantially perpendicularly from an edge of the frame along the side wall of the CPU toward the ear portion, and an actuation portion formed substantially at said edge of the frame and raised above the claw portions, the actuation portion extending from the frame in a direction away from the CPU; wherein the frame has a generally U-shaped configuration comprising a base portion and two arm portions perpendicularly extending from opposite sides of the base portion over the top surface of the CPU and terminating part of the way along a dimension of the CPU.

2. The connector assembly as described in claim 1, wherein the base portion and the arm portions are in a same plane.

3. The connector assembly as described in claim 2, wherein the frame has at least one clip portion which extends from an edge of the frame and is perpendicular to the claw portions for positioning the actuation device more securely on the CPU.

4. A connector assembly comprising:

an electrical connector with a rectangular contour, defining an ear portion on at least one side;

a CPU positioned on the connector;

an actuation device grasping the CPU, said actuation device including a base portion extending along said side, a pair of arm portions extending from two opposite ends of the base portion in a direction away from said ear portion, both said pair of arms terminating around a half of dimension of said CPU along said direction, clip and claw portions extending downwardly from outer edges of the arm portions and the base portion and abutting against corresponding side faces of the CPU, and an actuation portion extending obliquely upwardly from the outer edge of the base portion in alignment with the ear portion.

\* \* \* \* \*